United States Patent
Ikeda et al.

(10) Patent No.: US 11,658,109 B2
(45) Date of Patent: May 23, 2023

(54) ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 848 days.

(21) Appl. No.: 16/078,602

(22) PCT Filed: Jul. 14, 2017

(86) PCT No.: PCT/JP2017/025641
§ 371 (c)(1),
(2) Date: Aug. 21, 2018

(87) PCT Pub. No.: WO2019/012678
PCT Pub. Date: Jan. 17, 2019

(65) Prior Publication Data
US 2021/0210422 A1    Jul. 8, 2021

(51) Int. Cl.
*H01L 23/498* (2006.01)
*H01L 23/495* (2006.01)
(Continued)

(52) U.S. Cl.
CPC .. *H01L 23/49861* (2013.01); *H01L 23/49575* (2013.01); *H01L 23/49833* (2013.01); *H01L 23/49838* (2013.01); *H01L 23/5385* (2013.01); *H01L 24/32* (2013.01); *H01L 25/071* (2013.01); *H01L 2224/32225* (2013.01); *H01L 2924/13055* (2013.01); *H01L 2924/13091* (2013.01)

(58) Field of Classification Search
CPC ... H01L 23/49838; H01L 24/32; H01L 24/37; H01L 24/29; H01L 24/33
See application file for complete search history.

(56) References Cited

U.S. PATENT DOCUMENTS 5,218,231 A    6/1993   Kudo
6,642,576 B1 *  11/2003  Shirasawa ............. H01L 25/071
                                                      257/327
(Continued)

FOREIGN PATENT DOCUMENTS

CN        101501847 A    8/2009
EP          0631312 A1   12/1994
(Continued)

OTHER PUBLICATIONS

International Search Report for PCT/JP2017/025641 dated Apr. 20, 2018 and its English translation from Google Translate.
(Continued)

*Primary Examiner* — Michele Fan
(74) *Attorney, Agent, or Firm* — Ladas & Parry, LLP

(57) ABSTRACT

An electronic module has a first substrate 11, a first electronic element 13, a second electronic element 23, a second substrate 21, a first terminal part 110 provided on a side of the first substrate 11 and a second terminal part 120 provided on a side of the second substrate 21. The first terminal part 110 has a first surface direction extending part 114 and a first normal direction extending part 113 extending toward one side or the other side. The second terminal part 120 has a second surface direction extending part 124 and a second normal direction extending part 123 extending toward one side or the other side. The second surface direction extending part 124 is provided on one side of the first surface direction extending part 114, and the first surface direction extending part 114 and the second surface direction extending part 124 overlap one another in a surface direction.

3 Claims, 14 Drawing Sheets

(51) Int. Cl.
*H01L 23/538* (2006.01)
*H01L 23/00* (2006.01)
*H01L 25/07* (2006.01)

(56) References Cited

U.S. PATENT DOCUMENTS

| | | | |
|---|---|---|---|
| 8,946,567 B2* | 2/2015 | Nakatsu | H02M 7/003 |
| | | | 174/547 |
| 2007/0284720 A1* | 12/2007 | Otremba | H01L 23/49524 |
| | | | 257/690 |
| 2009/0140289 A1 | 6/2009 | Torii | |
| 2009/0257212 A1 | 10/2009 | Takano et al. | |
| 2011/0024896 A1* | 2/2011 | Tsunoda | H01L 24/33 |
| | | | 257/E23.08 |
| 2015/0008570 A1 | 1/2015 | Arai et al. | |
| 2017/0012030 A1* | 1/2017 | Wang | H01L 24/32 |

FOREIGN PATENT DOCUMENTS

| | | |
|---|---|---|
| EP | 310441 A1 | 12/2016 |
| EP | 3104411 A1 | 12/2016 |
| JP | S61166148 A | 7/1986 |
| JP | 2004047850 A | 2/2004 |
| JP | 2010-0016947 A | 1/2010 |
| JP | 2010016947 A * | 1/2010 |
| JP | 2013247192 A | 12/2013 |
| JP | 2014045157 A | 3/2014 |
| JP | 2015015270 A | 1/2015 |
| JP | 2016-185067 A | 10/2016 |

OTHER PUBLICATIONS

Written Opinion of the International Searching Authority for PCT/JP2017/025641 dated Apr. 20, 2018 and its English translation from Google Translate.
International Preliminary Report on Patentability for PCT/JP2017/025641 dated Jul. 14, 2017 and its English translation from Google Translate.
Netherlands, App. No. 2021291, Search Report, dated Mar. 20, 2019.
Office Action from JP app. No. 2018-530624, dated Jan. 8, 2019, with machine English translation from Google Translate.
First Office Action and search report from CN app. No. 201780012758.9, dated Dec. 30, 2021, with English translation from Global Dossier, all pages.

* cited by examiner ically connected to the first electronic element; and
a second terminal part provided on a side of the second substrate and electrically connected to the second electronic element;

ELECTRONIC MODULE

CROSS-REFERENCE TO RELATED APPLICATION

The present application is the U.S. national phase of PCT Application PCT/JP2017/025641 filed on Jul. 14, 2017, the disclosure of which is incorporated herein by reference in its entirety.

TECHNICAL FIELD

The present invention relates to an electronic module having a terminal part.

BACKGROUND ART

Conventionally, electronic modules in which a plurality of electronic elements are provided inside a sealing resin are known (refer to JP 2014-45157 A, for example). With regards to such electronic modules, downsizing thereof is desired.

One means for downsizing that can be considered is to adopt an aspect in which electronic elements are stacked on top of one another in layered state. In doing so, it can be considered to provide, at one side (for example, the front surface-side) of an electronic element (a first electronic element), another electronic element (a second electronic element).

The number of electronic elements increases when such an aspect is adopted, and thus, it is necessary to increase the number of terminals for connection to an external device. When the terminals are provided only to either the substrate to which the first electronic element is provided or the substrate to which the second electronic element is provided, space for arranging the terminals becomes necessary and the size in the surface direction unfortunately increases.

SUMMARY OF INVENTION

Technical Problem

The present invention provides an electronic module of which an increase in size in the surface direction can be prevented.

Solution to Problem

An electronic module according to the present invention may comprise:
a first substrate;
a first electronic element provided on one side of the first substrate;
a second electronic element provided on one side of the first electronic element;
a second substrate provided on one side of the second electronic element;
a first terminal part provided on a side of the first substrate and electrically connected to the first electronic element; and
a second terminal part provided on a side of the second substrate and electrically connected to the second electronic element;
wherein the first terminal part may have a first surface direction extending part that extends along a surface direction of the first substrate, and a first normal direction extending part that is provided at an end part of the first surface direction extending part and extends toward one side or the other side,
the second terminal part may have a second surface direction extending part that extends along a surface direction of the second substrate, and a second normal direction extending part that is provided at an end part of the second surface direction extending part and extends toward one side or the other side,
the second surface direction extending part may be provided on one side of the first surface direction extending part, and the first surface direction extending part and the second surface direction extending part may overlap one another in a surface direction.

In the electronic module according to the present invention,
the second normal direction extending part may extend toward one side,
the first surface direction extending part may extend outside of a periphery of the second surface direction extending part, and
the first normal direction extending part may extend toward one side outside of a periphery of the second normal direction extending part.

In the electronic module according to the present invention,
a one side-end part of the first normal direction extending part and a one side-end part of the second normal direction extending part may extend to substantially the same position.

In the electronic module according to the present invention,
the first normal direction extending part may extend toward the other side, and
the second normal direction extending part may extend toward one side.

In the electronic module according to the present invention,
a plurality of first terminal parts may be provided,
second terminal parts, whose number is equal to the number of the first terminal parts, may be provided,
a second surface direction extending part may be provided on one side of each first surface direction extending part, and
a first surface direction extending part may be provided on the other side of each second surface direction extending part.

In the electronic module according to the present invention,
the first surface direction extending part and the second surface direction extending part may substantially completely overlap one another in a width direction of the terminal part.

Advantageous Effects of Invention

As an aspect of the present invention, when an aspect, in which the first terminal part and the second terminal part are respectively provided on the first substrate-side and the second substrate-side and at least a part of the second surface direction extending part is positioned on one side of the first surface direction extending part, is adopted, terminal parts can be arranged by using both the first substrate and the second substrate and as a result of this, the size in the surface direction can be made small.

BRIEF DESCRIPTION OF DRAWINGS

In FIG. 10, first normal direction extending parts and second normal direction extending parts are indicated by broken lines, and first surface direction extending parts and second surface direction extending parts are indicated by solid lines.

DESCRIPTION OF EMBODIMENTS

First Embodiment

«Structure»

Figure 1:
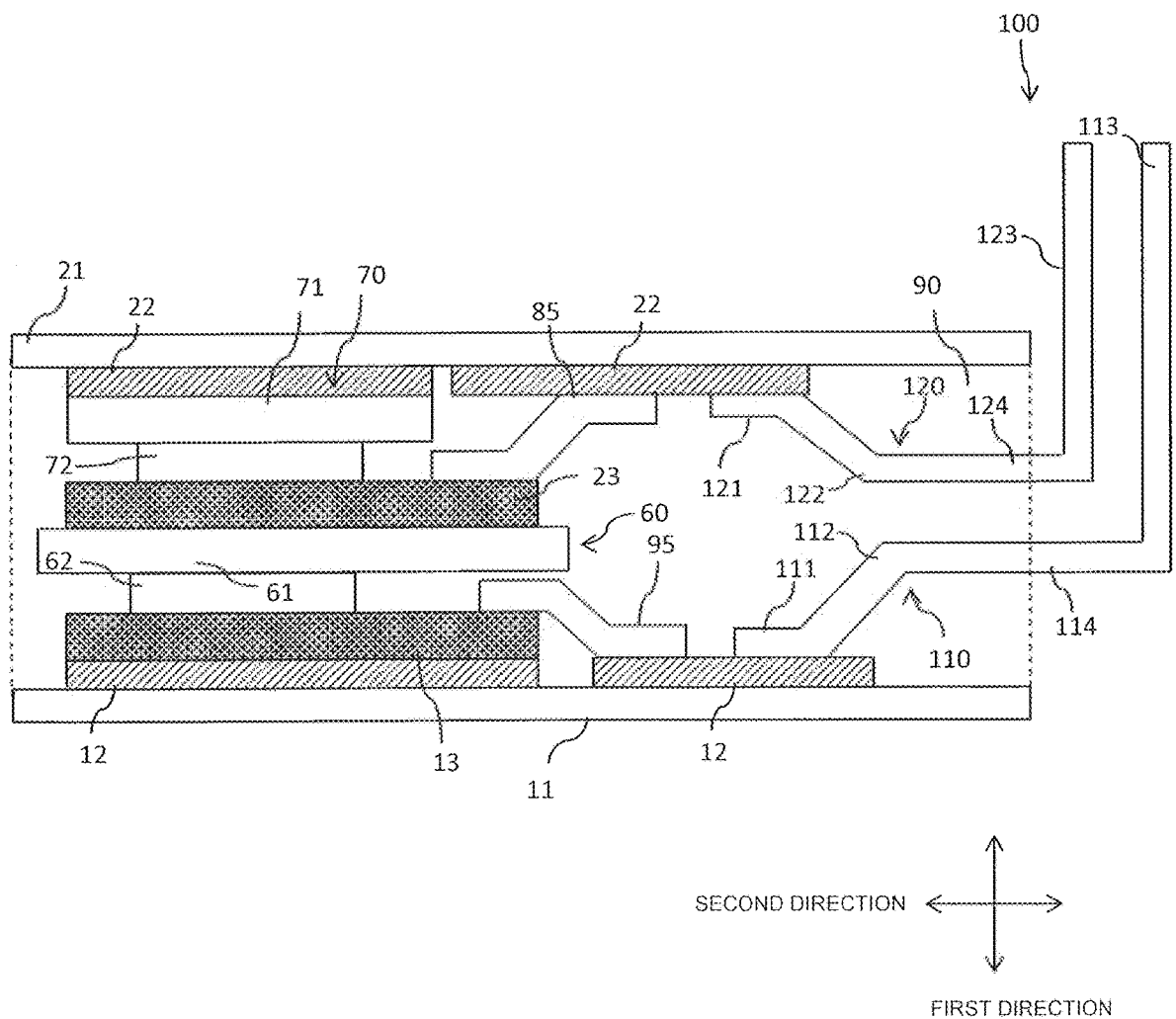
FIG. 1 is a longitudinal section view of an electronic module that may be used in a first embodiment of the present invention.

In the present embodiment, the term "one side" refers to the upper side in FIG. 1, and the term "other side" refers to the lower side in FIG. 1. The top-bottom direction and left-right direction of FIG. 1 are referred to as a "first direction" and "second direction" respectively, and the front-rear direction of the sheet is referred to as a "third direction". The in-plane direction including the second and third directions is referred to as a "surface direction" and the term "plan view" is used for a view taken from one side.

An electronic module of the present embodiment may have a first electronic unit and a second electronic unit.

As illustrated in FIG. 1, the first electronic unit may have a first substrate 11, a plurality of first conductor layers 12 provided on one side of the first substrate 11, and a first electronic element 13 provided on one side of a first conductor layer 12. The first electronic element 13 may be a switching element or a controlling element. When the first electronic element 13 is a switching element, the first electronic element 13 may be a MOSFET, an IGBT, or the like. The first electronic element 13 and the later-described second electronic element 23 may each be constituted of a semiconductor element, and the semiconductor material may be silicon, silicon carbide, gallium nitride, or the like. The other side-surface of the first electronic element 13 may be connected to a first conductor layer 12 via an electroconductive adhesive (not illustrated) such as solder.

A first connector body 60 may be provided on one side of the first electronic element 13. The first connector body 60 may be connected to the one side-surface of the first electronic element 13 via an electroconductive adhesive such as solder.

As illustrated in FIG. 1, the second electronic unit may be provided on one side of the first connector body 60. The second electronic unit may have a second electronic element 23 disposed on one side of the first connector body 60. Further, the second electronic unit may have a second substrate 21, and a second conductor layer 22 provided on the other side of the second substrate 21. A second connector body 70 may be provided on the other side of a second conductor layer 22. The second connector body 70 may be connected to the one side-surface of the second electronic element 23 and the other side-surface of a second conductor layer 22 via an electroconductive adhesive such as solder.

The second electronic element 23 may be a switching element or a controlling element. When the second electronic element 23 is a switching element, the second electronic element 23 may be a MOSFET, an IGBT, or the like.

The first connector body 60 may have a first head part 61, and a first pillar part 62 extending toward the other side from the first head part 61. The second connector body 70 may have a second head part 71, and a second pillar part 72 extending toward the other side from the second head part 71. The first connector body 60 may have a substantially T-shaped cross-section and the second connector body 70 may also have a substantially T-shaped cross-section.

As the first substrate 11 and the second substrate 21, ceramic substrates, insulating resin layers, or the like can be adopted. Other than solder, materials containing Ag and Cu as main components can be used as an electroconductive adhesive. As the material for the first connector body 60 and the second connector body 70, a metal such as Cu can be used. Note that metal substrates having circuit patterning applied thereon can be used as the substrates 11, 21, for example, and in this case, the substrates 11, 21 would also serve as the conductor layers 12, 22.

The electronic module may have a sealing part 90 constituted of a sealing resin or the like that seals therein the first electronic element 13, the second electronic element 23, the first connector body 60, the second connector body 70, the first conductor layers 12, the second conductor layer 22, and the like that have been described above.

A first conductor layer 12 may be connected to a terminal part 100, and a tip side of the terminal part 100 may be exposed to the outside of the sealing part 90 to be connectable to an external device such as a control board.

The terminal part 100 may have a first terminal part 110 that is electrically connected to the first electronic element 13, and a second terminal part 120 that is electrically connected to the second electronic element 23.

The first terminal part 110 may have a first surface direction extending part 114 that extends along the surface direction of the first substrate 11, and a first normal direction extending part 113 that is provided at an end part of the first surface direction extending part 114 and extends toward one side. The second terminal part 120 may have a second surface direction extending part 124 that extends along the surface direction of the second substrate 21, and a second normal direction extending part 123 that is provided at an end part of the second surface direction extending part 124 and extends toward one side. At least a part of the second surface direction extending part 124 may be positioned on one side of the first surface direction extending part 114 (refer to FIG. 5).

As illustrated in FIG. 1, the first surface direction extending part 114 may extend outside of the periphery of the second surface direction extending part 124. The first normal direction extending part 113 may extend toward one side outside of the periphery of the second normal direction extending part 123.

The one side-end part of the first normal direction extending part 113 and the one side-end part of the second normal direction extending part 123 may extend to substantially the same position. The phrase "extend to substantially the same position" indicates a state in which, between the one side-end parts of the first normal direction extending part 113 and the second normal direction extending part 123, only a difference corresponding to 5% or less of the entire length of the shorter one among the two normal direction extending parts (the second normal direction extending part 123 in the present embodiment) exists.

A plurality of first terminal parts 110 may be provided. Similarly, a plurality of second terminal parts 120 may be provided. Further, the number of the first terminal parts 110 and the number of the second terminal parts 120 may be equal. When the number of the first terminal parts 110 and the number of the second terminal parts 120 are equal as described above, a second surface direction extending part 124 may be provided on one side of each first surface direction extending part 114 and these surface direction extending parts may overlap one another in the surface direction. As one example of a case in which such an aspect is to be adopted, a case in which the first electronic element 13 provided on the first substrate 11 and the second electronic element 23 provided on the second substrate 21 have similar functions can be given.

Figure 4:
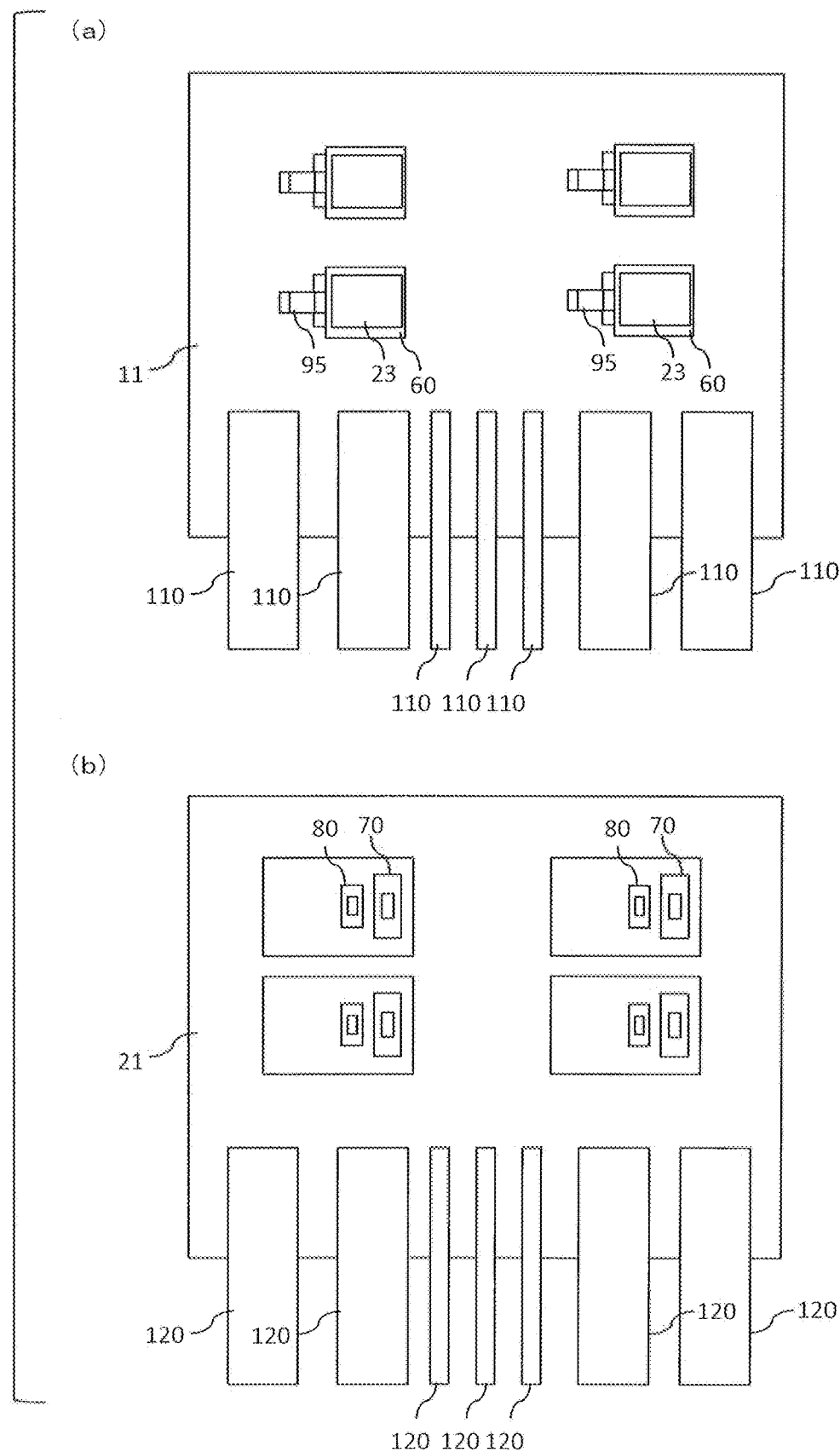
FIG. 4(a) is a plan view illustrating a structure of a first substrate-side that may be used in the first embodiment of the present invention.
FIG. 4(b) is a plan view illustrating a structure of a second substrate-side that may be used in the first embodiment of the present invention.
Figure 5:
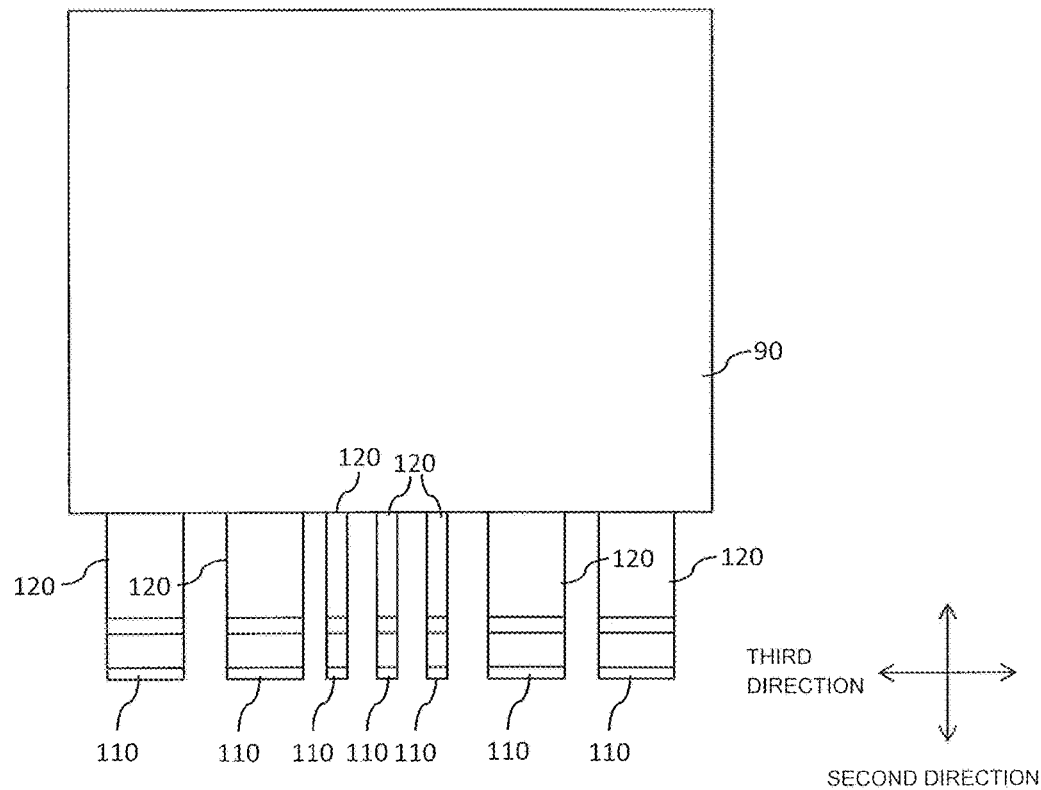
FIG. 5(a) is a plan view of the electronic module that may be used in the first embodiment of the present invention.
FIG. 5(b) is a cross-sectional view taken along straight line B-B in FIG. 5(a).
Figure 5:
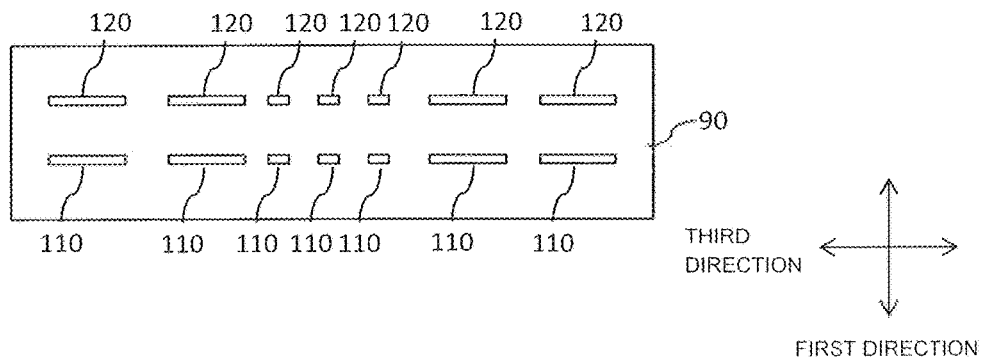

In the present embodiment, description is provided in the following using an aspect in which, as illustrated in FIGS. 4 and 5, the number of the first terminal parts 110 and the number of the second terminal parts 120 are equal, the first surface direction extending parts 114 and the second surface direction extending parts 124 are positioned at the same positions in plan view, and the second surface direction extending parts 124 are provided on one side of the first surface direction extending parts 114. However, limitation to such an aspect is not intended, and an aspect as in the later-described second embodiment in which the first surface direction extending parts 114 and the second surface direction extending parts 124 only partially overlap in plan view may be adopted.

As illustrated in FIG. 1, the first terminal part 110 may have a first terminal base end part 111 that is connected to a first conductor layer 12, the first surface direction extending part 114 described above, and a first bend part 112 that is provided between the first terminal base end part 111 and the first surface direction extending part 114 and is bent toward the other side at the first terminal base end part 111-side. The first terminal base end part 111 may be connected to the one side-surface of a first conductor layer 12 via an electroconductive adhesive.

The second terminal part 120 may have a second terminal base end part 121 that is connected to a second conductor layer 22, the second surface direction extending part 124 described above: and a second bend part 122 that is provided between the second terminal base end part 121 and the second surface direction extending part 124 and is bent toward one side at the second terminal base end part 121-side. The second terminal base end part 121 may be connected to the other side surface of a second conductor layer 22 via an electroconductive adhesive.

At the outside of the sealing part 90, the first surface direction extending part 114 and the second surface direction extending part 124 may be separated from one another in the first direction by a distance of a threshold value or more. The threshold value may be a value set based on safety standards. For example, when the electronic elements use a 600 V voltage, the first surface direction extending part 114 and the second surface direction extending part 124 need to be separated by a distance of 3.6 mm or more. In this case, the threshold value is 3.6 mm.

Figure 2:
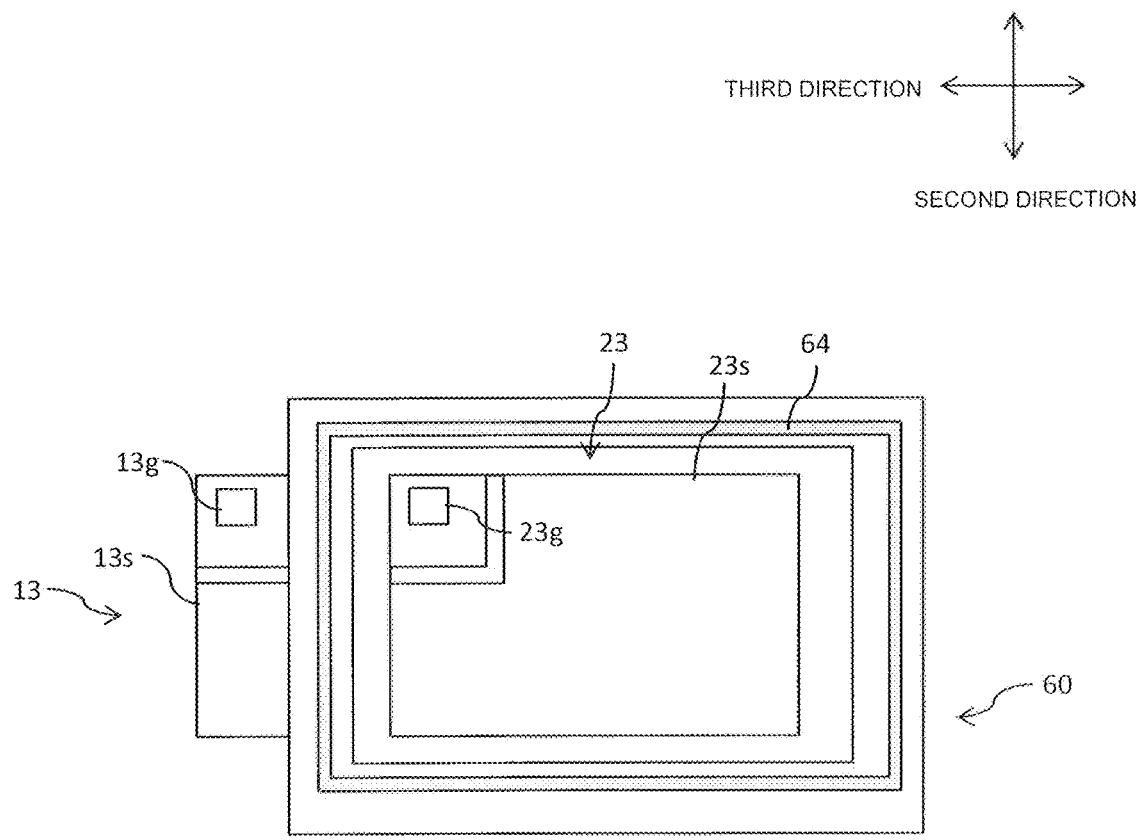
FIG. 2 is a plan view illustrating a first connector body and the like that may be used in the first embodiment of the present invention.

As illustrated in FIG. 2, a first groove part 64 may be provided on the one side-surface of the first head part 61. In plan view (in the surface direction), the first groove part 64 is provided outside of the periphery of the first pillar part 62. The first groove part 64 may be provided at a part of or over the entirety of the outside of the periphery of the first pillar part 62. An electroconductive adhesive such as solder may be provided on the one side-surface of the first head part 61 at the inside of the periphery of the first groove part 64, and the second electronic element 23 may be provided via an electroconductive adhesive.

Figure 3:
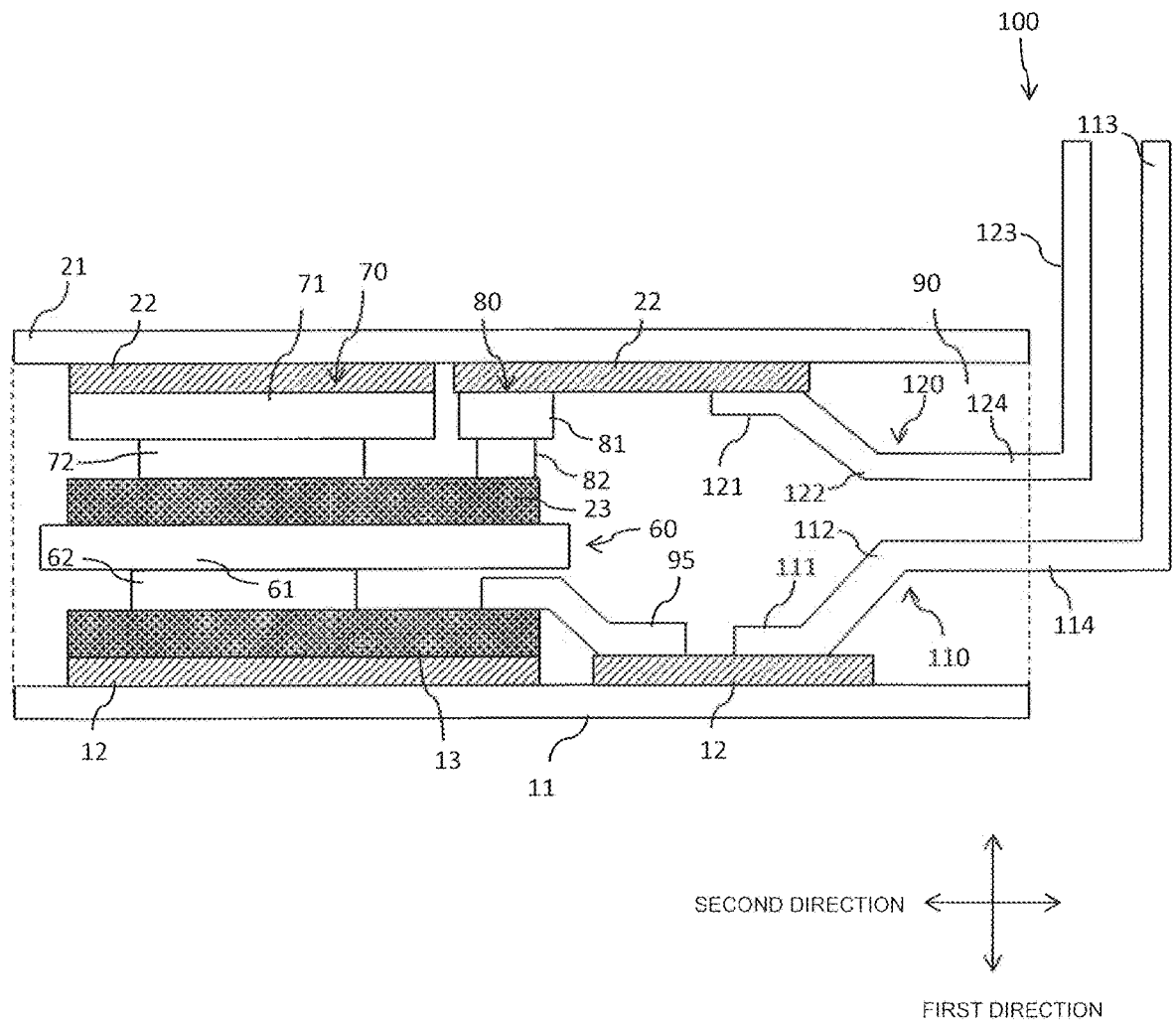
FIG. 3 is a longitudinal section view of an electronic module illustrating another example that may be used in the first embodiment of the present invention.

As illustrated in FIG. 1, a connector 85 that is connected to a terminal of the second electronic element 23, such as the later-described second gate terminal 23g, may be used. Limitation to such an aspect is not intended, and a third connector body 80 as illustrated in FIG. 3 may be used. The third connector body 80 may have a third head part 81, and a third pillar part 82 extending toward the other side from the third head part 81. The third connector body 80 may be connected to the other side-surface of a second conductor layer 22 and the one side-surface of the second electronic element 23 via an electroconductive adhesive such as solder.

As illustrated in FIG. 2, the first electronic element 13 may be in an aspect such that the first electronic element 13 is exposed to the outside from the first head part 61 in plan view. When the first electronic element 13 is a switching element such as a MOSFET, the first electronic element 13 may have a first gate terminal 13g and the like provided at the one side-surface thereof. Similarly, when the second electronic element 23 is a switching element such as a MOSFET, the second electronic element 13 may have a second gate terminal 23g and the like provided at the one side-surface thereof. The first electronic element 13 illustrated in FIG. 2 has the first gate terminal 13g and a first source terminal 13s at the one side-surface thereof, and the second electronic element 23 has the second gate terminal 23g and a second source terminal 23s at the one side-surface thereof. In this case, the second connector body 70 may be connected to the second source terminal 23s of the second electronic element 23 via an electroconductive adhesive, and the connector 85 may be connected to the second gate terminal 23g of the second electronic element 23 via an electroconductive adhesive. Further, the first connector body 60 may connect the first source terminal 13s of the first electronic element 13 and a second drain terminal provided on the other side of the second electronic element 23 with one another via an electroconductive adhesive. A first drain terminal provided on the other side of the first electronic element 13 may be connected to a first conductor layer 12 via an electroconductive adhesive. The first gate terminal 13g of the first electronic element 13 may be connected to a connector 95 (refer to FIG. 1) via an electroconductive adhesive, and the connector 95 may be connected to a first conductor layer 12 via an electroconductive adhesive.

When only one of the first electronic element 13 and the second electronic element 23 is a switching element, it can be considered to make a configuration such that the second electronic element 23 to be mounted on the first connector body 60 is a controlling element with low heat generation and the first electronic element 13 is the switching element. Contrarily, it can also be considered to make a configuration such that the second electronic element 23 to be mounted on the first connector body 60 is the switching element and the first electronic element 13 is a controlling element with low heat generation.

The bonding between the terminal part 100 and the conductor layers 12 and 22 is not limited to an aspect in which an electroconductive adhesive such as solder is used, and laser welding or ultrasonic bonding may be used.

«Functions and Effects»

Next, description is provided of the functions and effects of the present embodiment constituted of the above-described structure. Note that each one of the aspects described in the "Functions and Effects" section can be adopted in the above-described structure.

The number of the electronic elements 13, 23 increases when an aspect in which the second electronic element 23 is provided on one side of the first electronic element 13 is adopted in order to downsize the electronic module, and as a result, the number of the terminal parts 100 increases. With regards to this point, the adoption of an aspect in which the first terminal part 110 and the second terminal part 120 are respectively provided on the first substrate 11-side and the second substrate 21-side and at least a part of the second surface direction extending part 124 is positioned on one side of the first surface direction extending part 114 is beneficial because terminal parts 100 can be arranged by using both the first substrate 11 and the second substrate 21 and as a result of this, the size in the surface direction can be made small.

That is, even when the electronic elements 13, 23 inside are layered (are stacked), there are cases in which the number of the terminal parts 100 for transmitting the signals from the electronic elements 13, 23 increases and the size of the electronic module in the surface direction unfortunately becomes large. Further, when an aspect in which the terminal part 100 is connected to only either the first substrate 11-side or the second substrate 21-side is adopted, a member for electrically connecting a first conductor layer 12 and a second conductor layer 22 also becomes necessary. With regards to this point, providing the first terminal part 110 and the second terminal part 120 respectively to the first substrate 11-side and the second substrate 21-side is beneficial because such problems can be solved.

That is, when a circuit pattern that is for electrical connection to the terminal part 100 and that is formed of conductor layers 12, 22 is formed only on either the first substrate 11-side or the second substrate 21-side, not only the number of components increases but also the size in the surface direction becomes large. With regards to this point, by providing the first terminal part 110 and the second terminal part 120 respectively to the first substrate 11-side and the second substrate 21-side, both a first conductor layer 12 provided on the first substrate 11 and a second conductor layer 22 provided on the second substrate 21 can be used. As a result of this, a circuit pattern can be formed by using both the first substrate 11 and the second substrate 21, and an increase in size in the surface direction can be prevented.

Note that by preventing the increase in size in the surface direction, it would also become possible to prevent warping and deformation of the first substrate 11 and the second substrate 21.

Further, providing the first terminal part 110 and the second terminal part 120 respectively to the first substrate 11-side and the second substrate 21-side is beneficial in that wiring length can be shortened, whereby inductance can be reduced and wiring resistance can be reduced.

The adoption of an aspect in which the first normal direction extending part 113 and the second normal direction extending part 123 extend toward the same direction, namely one side in the aspect illustrated in FIG. 1, is beneficial because the first terminal part 110 and the second terminal part 120 can be connected to the same external device. For example, a control board for controlling the electronic module can be mentioned as the external device.

In this case, the first surface direction extending part 114 may extend outside of the periphery of the second surface direction extending part 124 and the first normal direction extending part 113 may extend toward one side outside of the periphery of the second normal direction extending part 123. By adopting such an aspect, it becomes possible to connect the first terminal part 110 and the second terminal part 120 to the same external device, such as a control board, even when the first surface direction extending part 114 and the second surface direction extending part 124 overlap in plan view.

By adopting an aspect in which the one side-end part of the first normal direction extending part 113 and the one side-end part of the second normal direction extending part 123 extend to substantially the same position, it becomes possible to more easily connect the first terminal part 110 and the second terminal part 120 to the same external device, such as a control board.

When an aspect in which the number of the first terminal parts 110 and the number of the second terminal parts 120 are equal, the first surface direction extending parts 114 and the second surface direction extending parts 124 are positioned at the same positions in plan view, and the second surface direction extending part 124 are provided on one side of the first surface direction extending parts 114 is adopted, it becomes possible to have a greater number of first terminal parts 110 and second terminal parts 120 overlap one another in plan view. As a result, such an aspect is beneficial for making it possible to adapt also to a case in which the number of the terminal parts 100 necessary increases and a case in which it is necessary to increase the widths of the terminal parts 100.

Note that, from the viewpoint of increasing the number of the terminal parts 100 and increasing the widths of the terminal parts 100, an aspect in which a second surface direction extending part 124 is provided on one side of each first surface direction extending part 114 and a first surface direction extending part 114 is provided on the other side of each second surface direction extending part 124 is beneficial. To provide further limitation, it is beneficial to adopt an aspect in which, in the width direction (the third direction) of the terminal parts 100, a first surface direction extending part 114 and a second surface direction extending part 124 substantially completely overlap one another (refer to FIGS. 4 and 5). Note that the phrase "substantially completely overlap one another" refers to an aspect in which, between a first surface direction extending part 114 and a second surface direction extending part 124, only a shift corresponding to one tenth or less of the width of the first surface direction extending part 114 and the second surface direction extending part 124 exists.

Second Embodiment

Next, description is provided of a second embodiment of the present invention.

Figure 6:
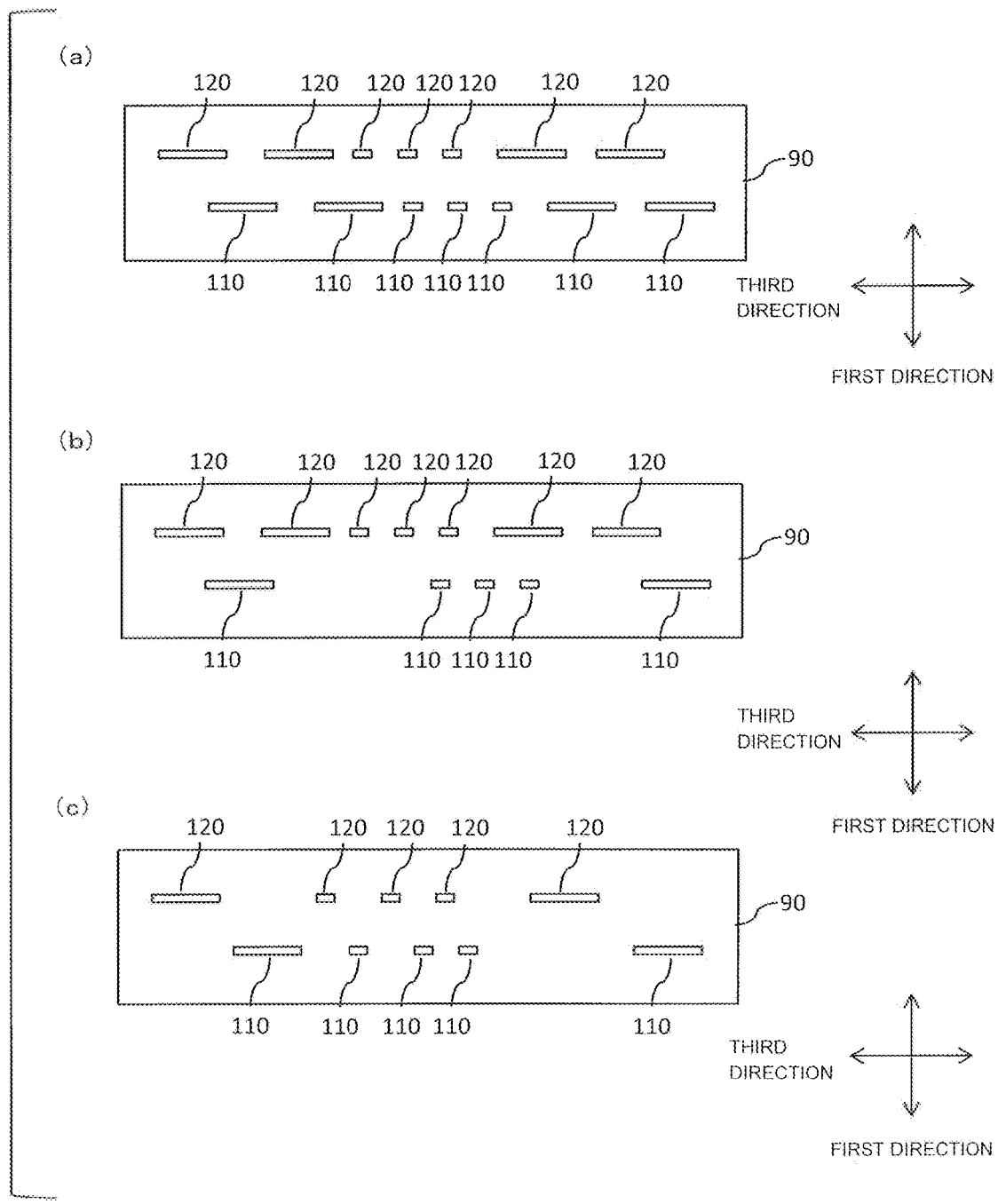
FIG. 6(a) is a cross-sectional view, corresponding to FIG. 5(b), of an electronic module that may be used in a second embodiment of the present invention.
FIG. 6(b) is a cross-sectional view, corresponding to FIG. 6(a), of another electronic module that may be used in the second embodiment of the present invention.
FIG. 6(c) is a cross-sectional view, corresponding to FIG. 6(a), of yet another electronic module that may be used in the second embodiment of the present invention.

In the aspect according to the first embodiment, a first surface direction extending part 114 and a second surface direction extending part 124 substantially completely overlap one another in plan view. Meanwhile, in an aspect according to the present embodiment, some first surface direction extending parts 114 and some second surface direction extending parts 124 overlap in plan view (in the third direction), as illustrated in FIG. 6. The present embodiment is similar to the first embodiment with regards to the rest of the structure, and each one of the aspects described in the first embodiment can be adopted in the present embodiment. The members having been described in the first embodiment are described by using the same reference signs.

Naturally, there are cases in which the first electronic element 13 provided on the first substrate 11 and the second electronic element 23 provided on the second substrate 21 have different functions. In such cases, there are cases in which the first terminal parts 110 and the second terminal parts 120 have different arrangements, as illustrated in FIG. 6(*b*). As a result, in plan view, only some and not all of the first surface direction extending parts 114 and second surface direction extending part 124 would overlap.

Even when the first electronic element 13 provided on the first substrate 11 and the second electronic element 23 provided on the second substrate 21 have similar functions, there are cases in which the first electronic element 13 and the second electronic element 23 are shifted with respect to one another in the surface direction. In such cases as well, only some and not all of the first surface direction extending parts 114 and second surface direction extending parts 124 would overlap one another in plan view (refer to FIG. 6(*a*)).

Further, when shifting in the surface direction is performed in such a manner, the minimum distance between a first terminal part 110 and a second terminal part 120 would be the diagonal-direction distance therebetween in a plane including the first direction and the third direction. Due to this, this is beneficial not only because it becomes easier to secure the distance stipulated by safety standards but also because thickness direction length can be reduced.

From this point of view, it can be considered to adopt an aspect which differs from the above-described aspect and in which the first surface direction extending parts 114 and the second surface direction extending parts 124 do not overlap at all in plan view as illustrated in FIG. 6(*c*).

Third Embodiment

Next, description is provided of a third embodiment of the present invention.

Figure 7:
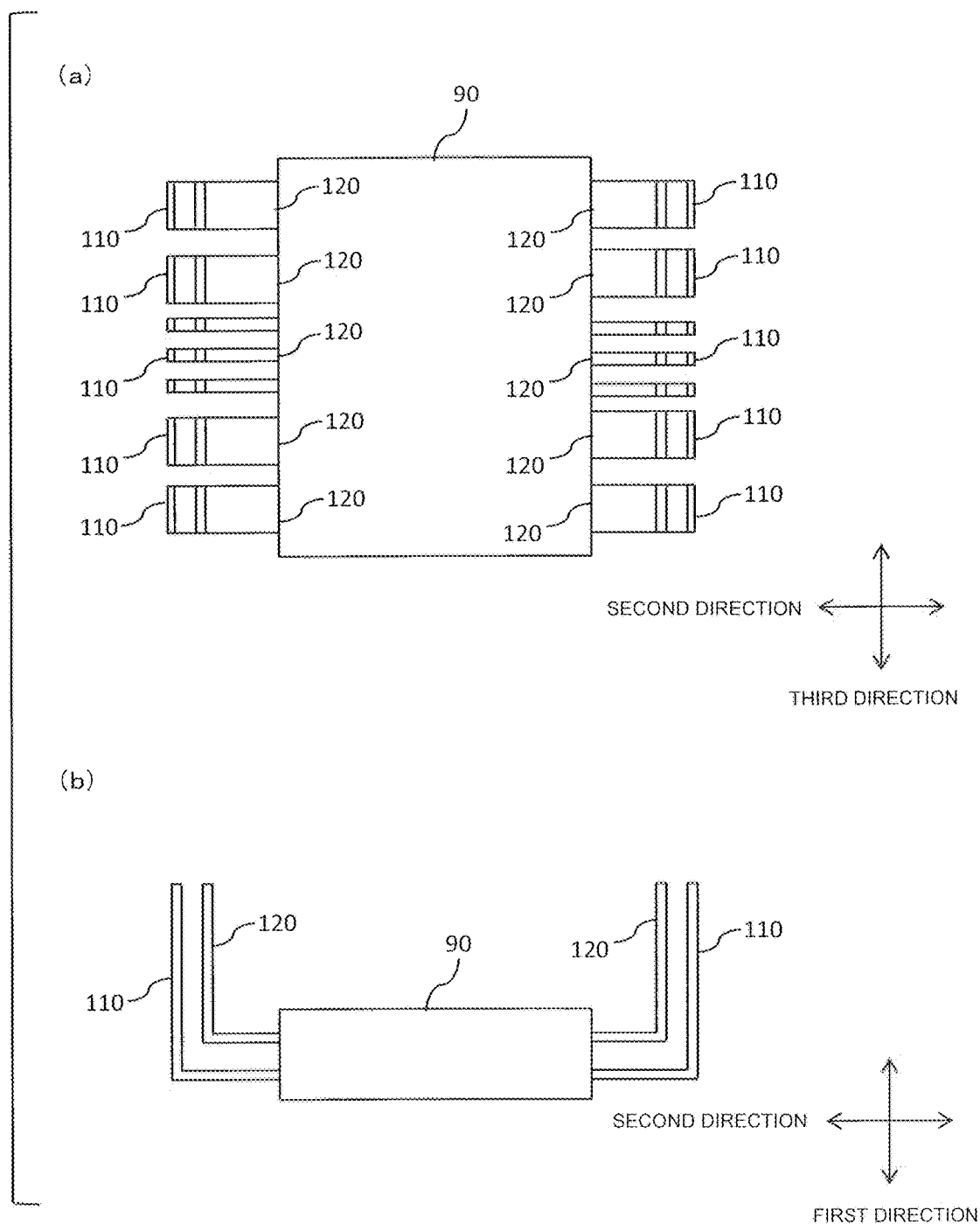
FIG. 7(a) is a plan view illustrating an electronic module that may be used in a third embodiment of the present invention.
FIG. 7(b) is a lateral view (diagram taken along a third direction) illustrating the electronic module that may be used in the third embodiment of the present invention.

In the aspects according to the embodiments above, the first terminal parts 110 and the second terminal parts 120 are exposed to the outside of the sealing part 90 from one lateral surface of the electronic module, and thus the aspects have a so-called Single Inline Package (SIP)-type structure. In an aspect according to the present embodiment, first terminal parts 110 and second terminal parts 120 are exposed to the outside of the sealing part 90 from two mutually-opposing lateral surfaces of the electronic module, and thus the aspect has a so-called Dual Inline Package (DIP)-type structure, as illustrated in FIG. 7. In the present embodiment, each one of the aspects described in the embodiments above can be adopted. The members having been described in the embodiments above are described by using the same reference signs.

The present embodiment is beneficial in that the number of the terminal parts 100 can be increased and the width-direction lengths of the terminal parts 100 can be increased, because the terminal parts 100 are exposed to the outside of the sealing part 90 by using two lateral surfaces. There are cases in which the width-direction lengths of the terminal parts 100 need to be increased, when the magnitude of current to be conducted thereby increases. The adoption of the present embodiment is beneficial because such a need can be met.

Fourth Embodiment

Next, description is provided of a fourth embodiment of the present invention.

Figure 8:
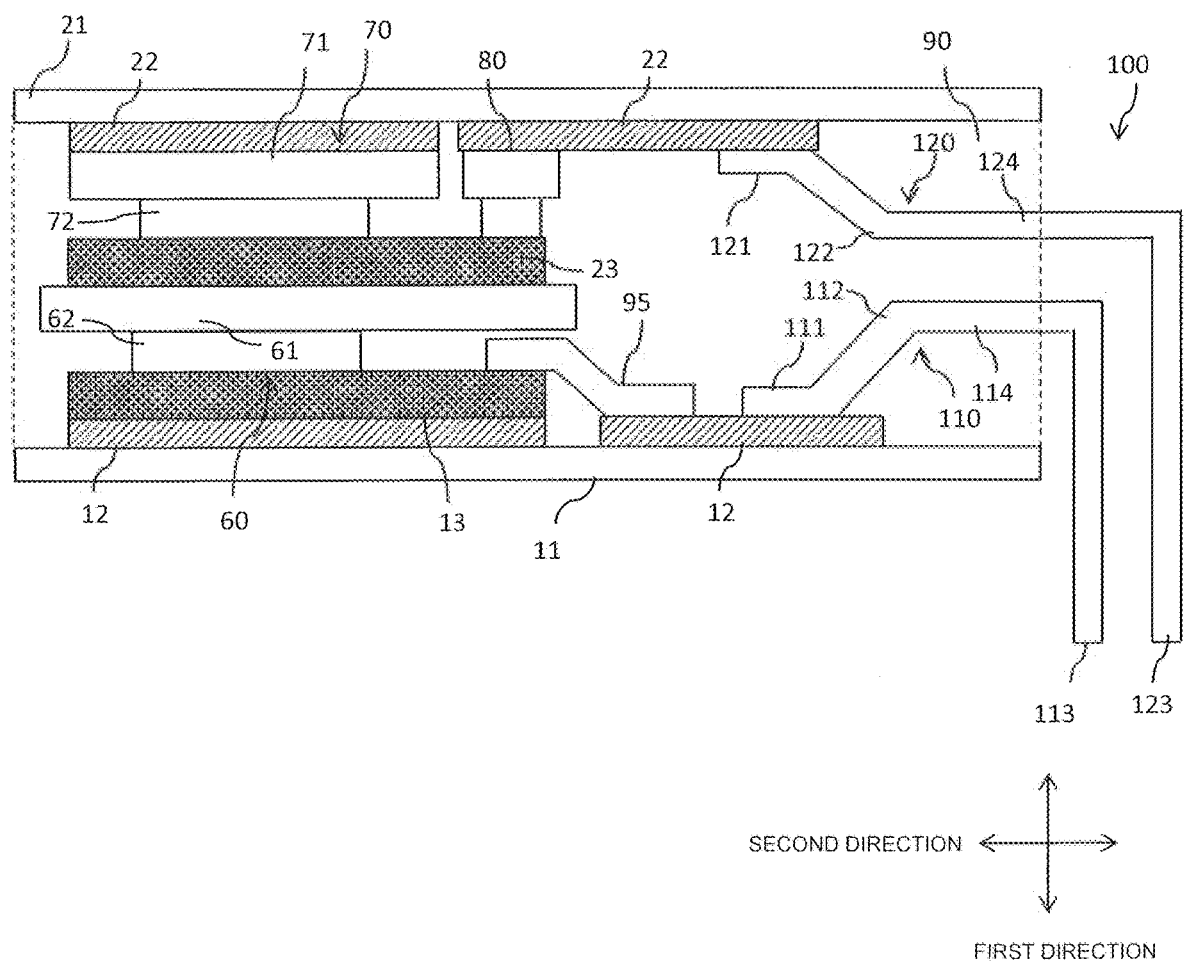
FIG. 8 is a longitudinal section view of an electronic module that may be used in a fourth embodiment of the present invention.

In the aspects according to the embodiments above, the first normal direction extending part 113 of the first terminal part 110 and the second normal direction extending part 123 of the second terminal part 120 extend toward one side. Meanwhile, in an aspect according to the present embodiment, the first normal direction extending part 113 of the first terminal part 110 and the second normal direction extending part 123 of the second terminal part 120 extend toward the other side, as illustrated in FIG. 8. Also, in the present embodiment, each one of the aspects described in the embodiments above can be adopted. The members having been described in the embodiments above are described by using the same reference signs.

In the aspect according to the present embodiment, the second surface direction extending part 124 extends outside of the periphery of the first surface direction extending part 114, and the second normal direction extending part 123 extends toward the other side outside of the periphery of the first normal direction extending part 113 does. By adopting such an aspect, it becomes possible to connect the first terminal part 110 and the second terminal part 120 to the same external device, such as a control board, even when the first surface direction extending part 114 and the second surface direction extending part 124 overlap in plan view.

An aspect in which the other side-end part of the first normal direction extending part 113 and the other side-end part of the second normal direction extending part 123 extend to substantially the same position may be adopted. When such an aspect is adopted, it becomes possible to more easily connect the first terminal part 110 and the second terminal part 120 to the same external device, such as a control board.

Fifth Embodiment

Next, description is provided of a fifth embodiment of the present invention.

Figure 9:
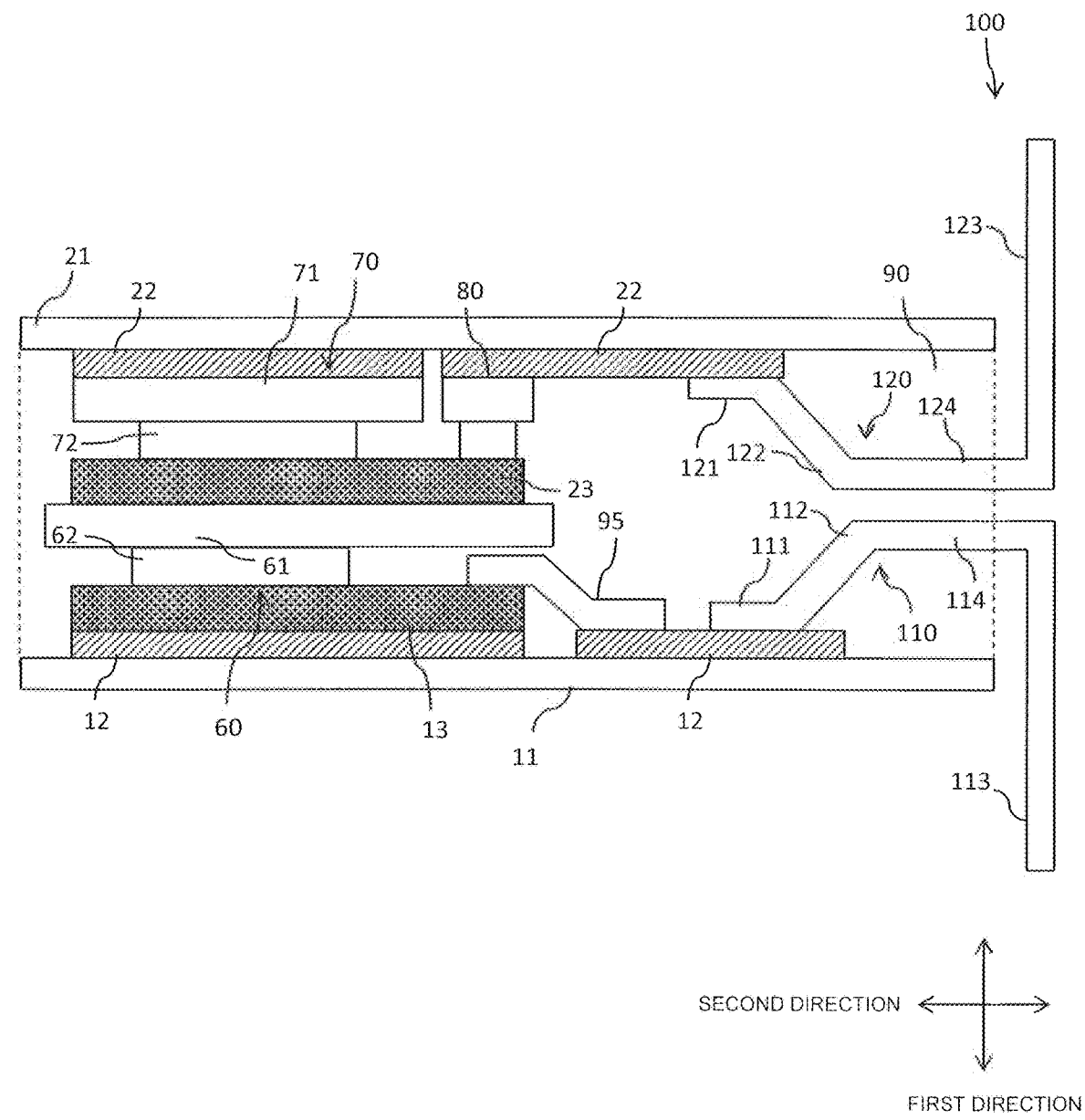
FIG. 9 is a longitudinal section view of an electronic module that may be used in a fifth embodiment of the present invention.

In the aspects according to the embodiments above, the first normal direction extending part 113 of the first terminal part 110 and the second normal direction extending part 123 of the second terminal part 120 extend toward the same direction. Meanwhile, in an aspect according to the present embodiment, the first normal direction extending part 113 of the first terminal part 110 extends toward the other side and the second normal direction extending part 123 of the second terminal part 120 extends toward one side, and thus the first and second normal direction extending parts 113 and 123 extend in opposite directions, as illustrated in FIG. 9. Also, in the present embodiment, each one of the aspects described in the embodiments above can be adopted. The members having been described in the embodiments above are described by using the same reference signs.

In the present embodiment, the first surface direction extending part 114 and the second surface direction extending part 124 may extend to substantially the same position. Further, differing from such an aspect, the first surface direction extending part 114 may extend outside of the periphery of the second surface direction extending part 124, or contrarily, the second surface direction extending part 124 may extend outside of the periphery of the first surface direction extending part 114.

When the present embodiment is adopted, it becomes possible to have the first normal direction extending part 113 of the first terminal part 110 extend toward the other side and to have the second normal direction extending part 123 of the second terminal part 120 to extend toward one side. Due to this, for example, an aspect in which the first terminal part 110 is connected to a first external device and the second terminal part 120 is connected to a second external device differing from the first external device can be adopted.

Limitation to such an aspect is not intended, and the first terminal part 110 and the second terminal part 120 may be connected to the same external device. Further, even in a case as described above in which the first and second external devices are adopted, the first and second external devices may be electrically connected to form one device unit.

Figure 10:
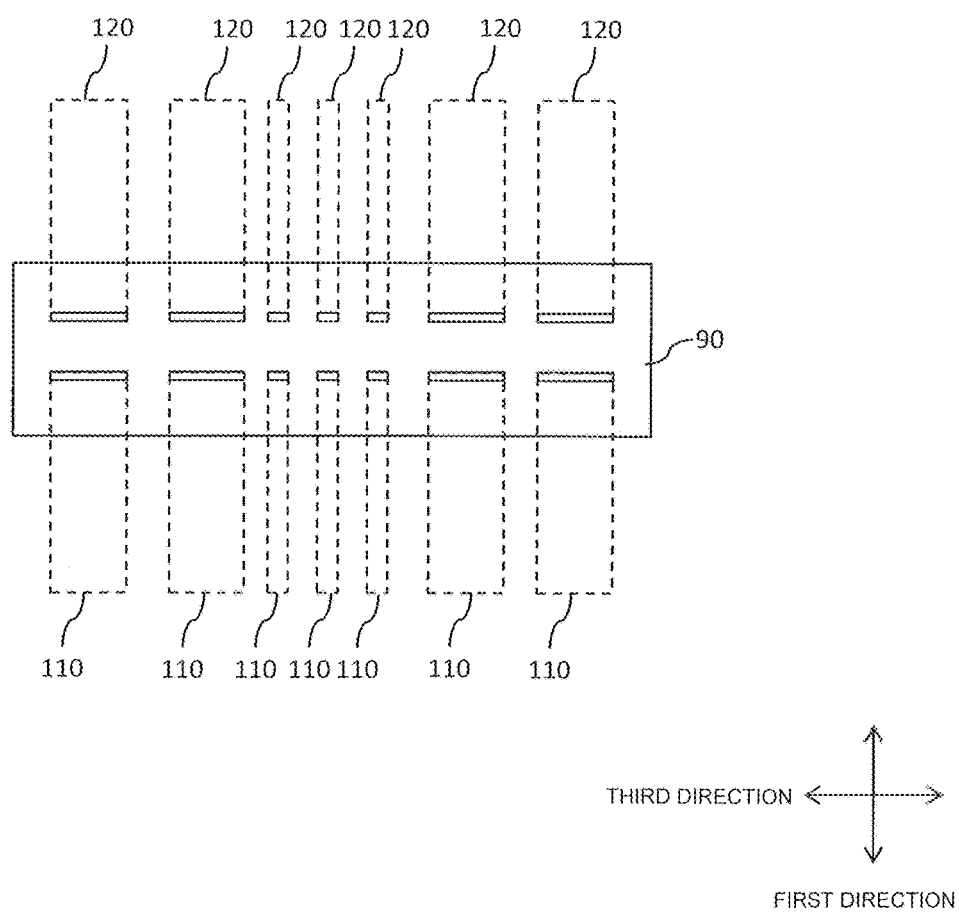
FIG. 10 is a front view (diagram taken along a second direction) of the electronic module that may be used in the fifth embodiment of the present invention.

Also, in the present embodiment, an aspect may be adopted in which the number of the first terminal parts 110 and the number of the second terminal parts 120 are equal, a second surface direction extending part 124 is provided on one side of each first surface direction extending part 114, and a first surface direction extending part 114 is disposed on the other side of each second surface direction extending part 124. To provide further limitation, an aspect in which a first surface direction extending part 114 and a second surface direction extending part 124 substantially completely overlap one another in plan view (in the third direction) may be adopted (refer to FIG. 10). Such a case is beneficial because the number of the terminal parts 100 can be increased and the width of the terminal part 100 can be increased.

Sixth Embodiment

Next, description is provided of a sixth embodiment of the present invention.

Figure 11:
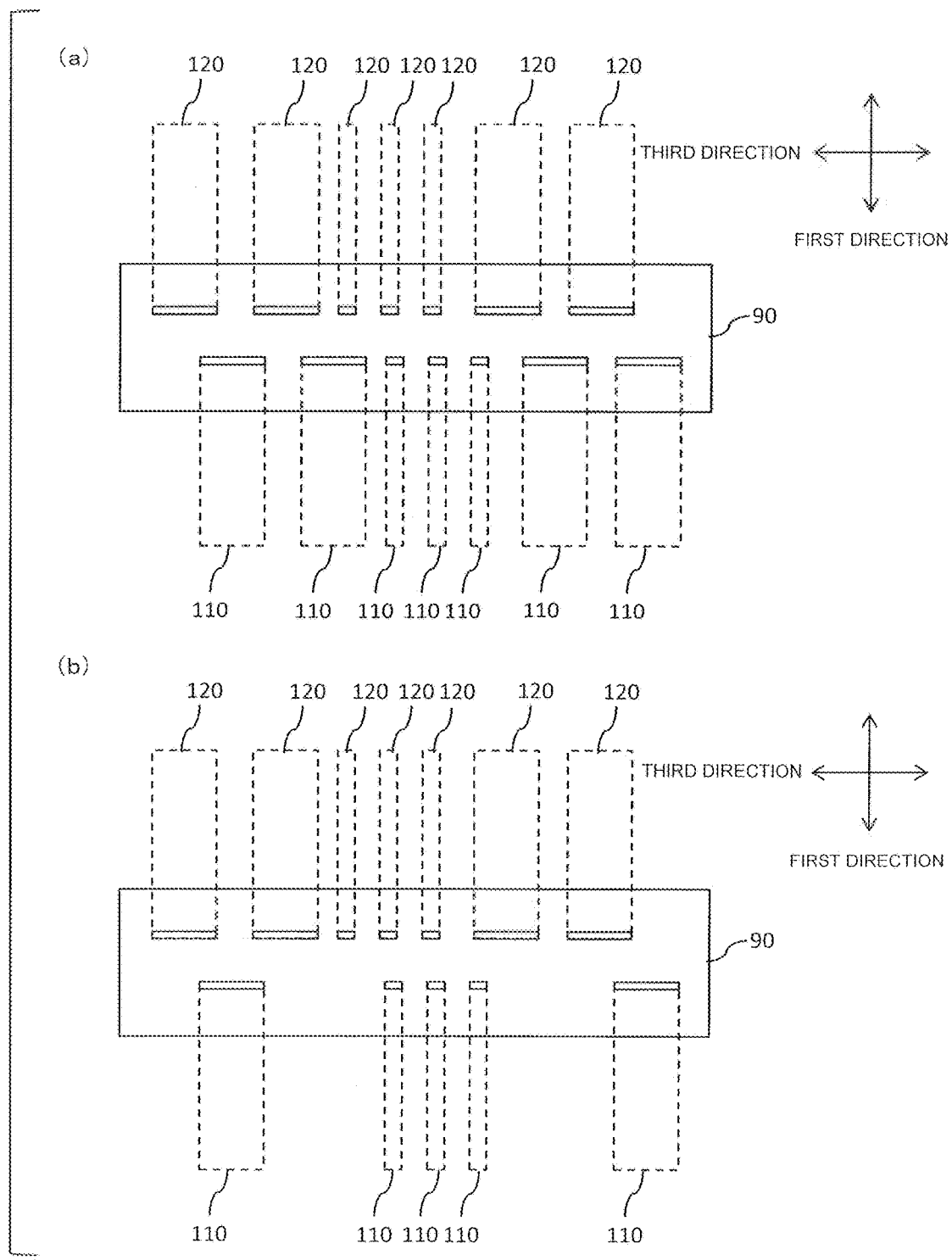
FIG. 11(a) is a front view of an electronic module that may be used in a sixth embodiment of the present invention.
FIG. 11(b) is a front view of another electronic module that may be used in the sixth embodiment of the present invention. Also, in FIG. 11, first normal direction extending parts and second normal direction extending parts are indicated by broken lines, and first surface direction extending parts and second surface direction extending parts are indicated by solid lines.

In the aspect according to the fifth embodiment, a first surface direction extending part 114 and a second surface direction extending part 124 substantially completely overlap one another in plan view. Meanwhile, in an aspect according to the present embodiment, some first surface direction extending part 114 and some second surface direction extending part 124 overlap in plan view (in the third direction), as illustrated in FIG. 11. The present embodiment is similar to the fifth embodiment with regards to the rest of the structure. Each one of the aspects described in the embodiments above can be adopted. The members having been described in the embodiments above are described by using the same reference signs.

As described above, naturally, there are cases in which the first electronic element 13 provided on the first substrate 11 and the second electronic element 23 provided on the second substrate 21 have different functions. In such cases, there are cases in which the first terminal parts 110 and the second terminal parts 120 have different arrangements (refer to FIG. 11(*b*)). As a result, in plan view, only some and not all of the first surface direction extending parts 114 and second surface direction extending part 124 would overlap.

Even when the first electronic element 13 provided on the first substrate 11 and the second electronic element 23 provided on the second substrate 21 have similar functions, there are cases in which the first electronic element 13 and the second electronic element 23 are shifted with respect to one another in the surface direction. In such cases as well, in plan view, only some and not of the first surface direction extending parts 114 and the second surface direction extending parts 124 would overlap one another (refer to FIG. 11(*a*)).

Further in order to increase the distance between a first surface direction extending part 114 and a second surface direction extending part 124, an aspect in which the first surface direction extending parts 114 and the second surface direction extending parts 124 do not overlap at all can be adopted (refer to FIG. 6(*c*), although FIG. 6(*c*) is a drawing related to a different embodiment).

Seventh Embodiment

Next, description is provided of a seventh embodiment of the present invention.

Figure 12:
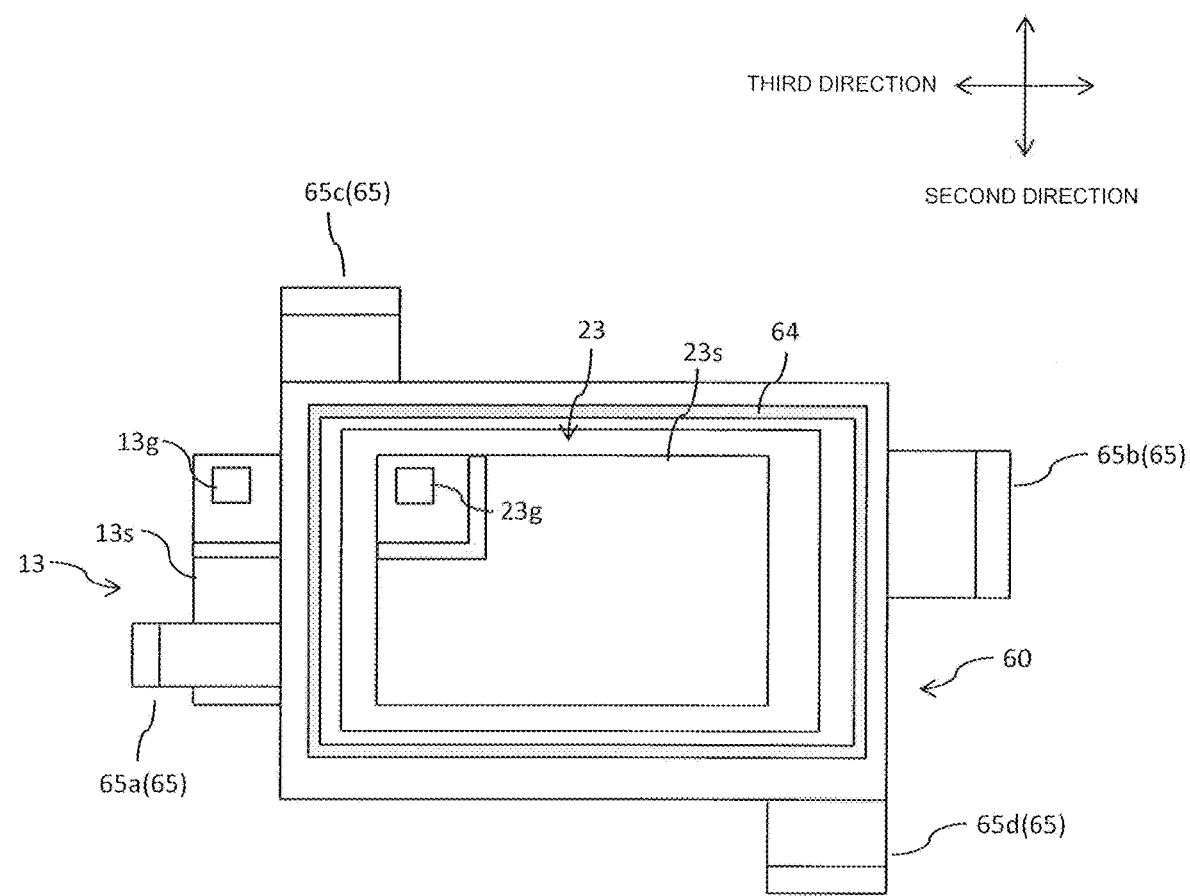
FIG. 12 is a plan view for illustrating a first connector body that may be used in a seventh embodiment of the present invention.

In the embodiments above, the first connector body 60 with the substantially T-shaped cross-section is used. Meanwhile, the first connector body 60 in the present embodiment has four support parts 65 (namely, support parts 65*a* to 65*d*) extending from the first head part 61 toward the other side, as illustrated in FIG. 12. The support parts 65 are each configured to contact a first conductor layer 12 or the first substrate 11. Also, in the present embodiment, each one of the aspects described in the embodiments above can be adopted. The members having been described in the embodiments above are described by using the same reference signs.

In the present embodiment, description is provided by using an aspect in which four support parts 65 are used, but limitation to such an aspect is not intended, and one, two, three, or five or more support parts 65 may be used.

When support parts 65 extending from the first head part 61 are provided as in the present embodiment, tilting of the first connector body 60 due to the weight of the second electronic element 23, upon mounting of the second electronic element 23 or after the second electronic element 23 has been mounted, can be prevented. Further, heat dissipation can be enhanced due to the support parts 65 each contacting the first substrate 11 or a first conductor layer 12 as described above. In particular, a case in which a support part 65 contacts a first conductor layer 12 is beneficial because the heat dissipation effect can be enhanced to a further extent.

Further, a case in which a plurality of support parts 65 are provided as in the present embodiment is beneficial because the first connector body 60 can be provided in a stable manner and a higher heat dissipation effect can be achieved.

Eighth Embodiment

Next, description is provided of an eighth embodiment of the present invention.

Figure 13:
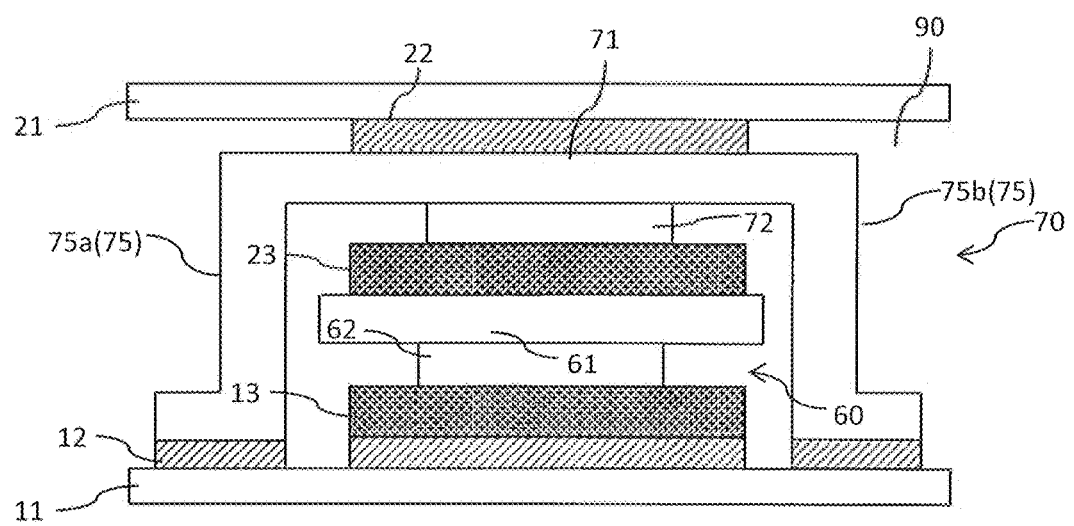
FIG. 13 is a longitudinal section view for illustrating a second connector body that may be used in an eighth embodiment of the present invention.

In the embodiments above, description is provided using the second connector body 70 constituted of the substantially T-shaped cross-section and having the second pillar part 72. Meanwhile, in the present embodiment, the second connector body 70 has extending parts 75 (namely, extending parts 75a, 75b) extending from the second head part 71 toward the other side, as illustrated in FIG. 13. Also, in the present embodiment, each one of the aspects described in the embodiments above can be adopted. The members having been described in the embodiments above are described by using the same reference signs.

In the present embodiment, description is provided by using an aspect in which two extending parts 75 are used, but limitation to such an aspect is not intended, and one or three or more extension parts 75 may be used.

According to the present embodiment, due to the extending parts 75 being provided, heat from the second electronic element 23 can be effectively dissipated and a high heat dissipation effect can be achieved also by the second connector body 70.

Further, a case in which a plurality of extending parts 75 are provided as in the present embodiment is beneficial because a higher heat dissipation effect can be achieved.

Ninth Embodiment

Next, description is provided of a ninth embodiment of the present invention.

Figure 14:
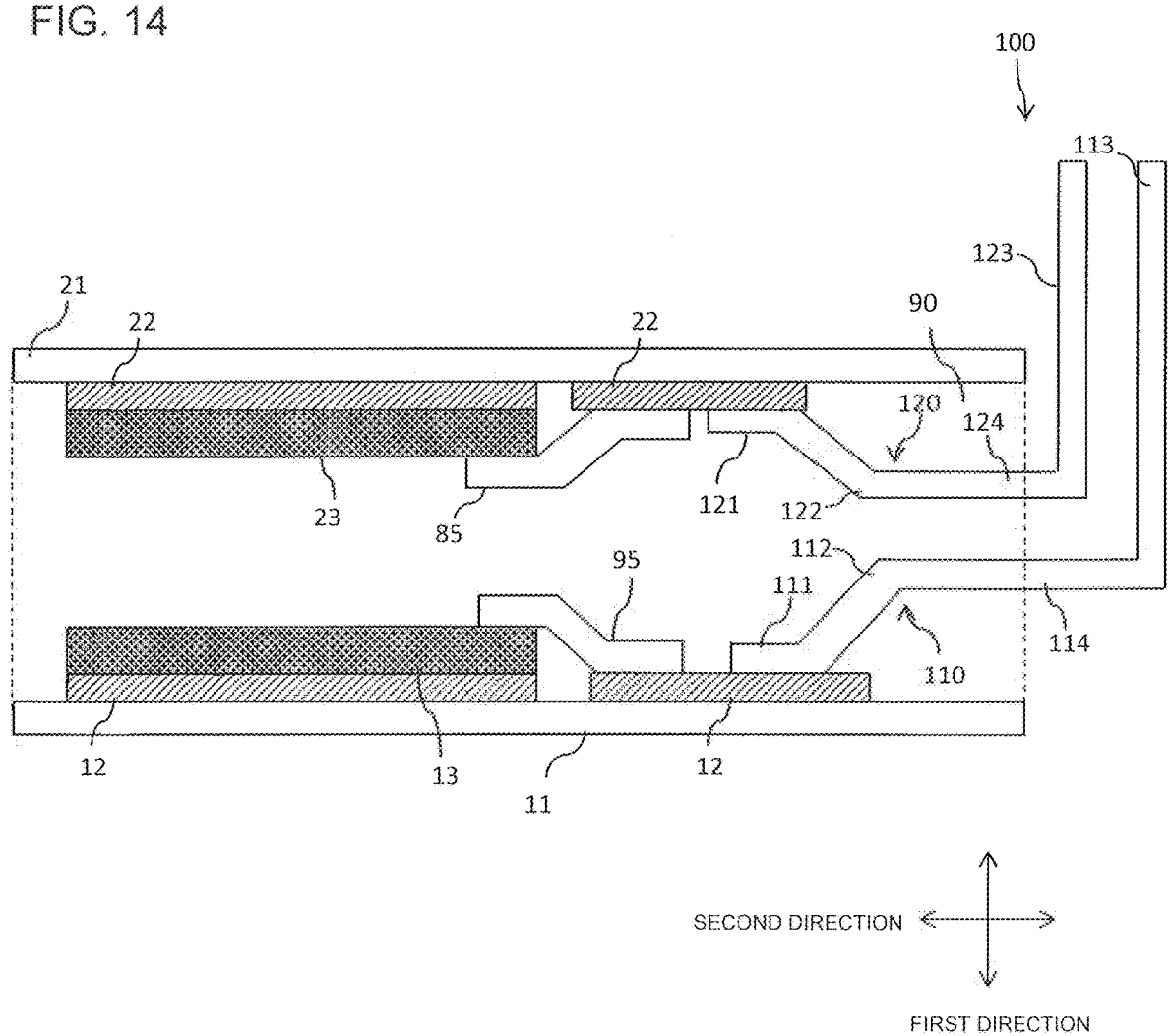
FIG. 14 is a longitudinal section view of an electronic module that may be used in a ninth embodiment of the present invention.

In the embodiments above, description is provided by using an aspect in which the first connector body 60 and the second connector body 70 are used, but limitation to such an aspect is not intended. As illustrated in FIG. 14, the first connector body 60 and the second connector body 70 may not be provided. Also, in the present embodiment, each one of the aspects described in the embodiments above can be adopted. The members having been described in the embodiments above are described by using the same reference signs.

The effects described with regards to the above-described terminal parts 100 can also be yielded in the present embodiment, and the size in the surface direction can be reduced.

The description of the embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

11 First substrate
13 First electronic element
21 Second substrate
23 Second electronic element
110 First terminal part
113 First normal direction extending part
114 First surface direction extending part
120 Second terminal part
123 Second normal direction extending part
124 Second surface direction extending part

The invention claimed is:

1. An electronic module comprising:
a first substrate;
a first electronic element provided on an upper side of the first substrate;
a first connector body provided on an upper side of the first electronic element;
a second electronic element provided on an upper side of the first connector body;
a second connector body provided on an upper side of the second electronic element,
a second substrate provided on an upper side of the second connector body;
a first terminal part provided on the upper side of the first substrate and electrically connected to the first electronic element; and
a second terminal part provided on a down side of the second substrate and electrically connected to the second electronic element;
wherein the first terminal part has a first terminal base end part, a first surface direction extending part that extends along a surface direction of the first substrate, and a first normal direction extending part that is provided at an end part of the first surface direction extending part and extends upward away from the upper side of the first substrate,
the second terminal part has a second terminal base end part, a second surface direction extending part that extends along a surface direction of the second substrate, and a second normal direction extending part that is provided at an end part of the second surface direction extending part and extends upward toward upper side of the second substrate,
the second surface direction extending part is provided on upper side of the first surface direction extending part, wherein the first surface direction extending part and the second surface direction extending part overlap one another in a surface direction.

2. The electronic module according to claim 1, wherein the first terminal part has a first bend part that is provided between the first terminal base end part and the first surface direction extending part, and that is bent upward away from the upper side of the first substrate, and
the second terminal part has a second bend part that is provided between the second terminal base end part and the second surface direction extending part, and that is bent downward away from down side of the second substrate.

3. The electronic module according to claim 1, wherein a plurality of first terminal parts is provided,
second terminal parts, whose number is equal to the number of the first terminal parts, are provided,
each of the second surface direction extending parts is provided on an upper side of each of the first surface direction extending parts.

* * * * *